(12) United States Patent
Zheng (10) Patent No.: US 8,637,974 B2
(45) Date of Patent: Jan. 28, 2014

(54) INTEGRATED CIRCUIT PACKAGING SYSTEM WITH TIEBAR-LESS DESIGN AND METHOD OF MANUFACTURE THEREOF

(75) Inventor: Zheng Zheng, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/523,261

(22) Filed: Jun. 14, 2012

(65) Prior Publication Data

US 2013/0334674 A1    Dec. 19, 2013

(51) Int. Cl.
*H01L 23/48* (2006.01)

(52) U.S. Cl.
USPC ............ 257/692; 257/E23.031; 257/E23.061; 257/E21.51; 438/123; 438/124

(58) Field of Classification Search
USPC ................. 438/123, 124; 257/692, E23.031, 257/E23.061, E21.51
See application file for complete search history.

(56) References Cited

U.S. PATENT DOCUMENTS

| | | | |
|---|---|---|---|
| 6,348,726 B1 | 2/2002 | Bayan et al. | |
| 7,109,572 B2 | 9/2006 | Fee et al. | |
| 7,262,491 B2 * | 8/2007 | Islam et al. | 257/670 |
| 7,732,901 B2 | 6/2010 | Camacho et al. | |
| 7,790,500 B2 * | 9/2010 | Ramos et al. | 438/106 |
| 2005/0051877 A1 * | 3/2005 | Hsu | 257/667 |
| 2008/0290486 A1 * | 11/2008 | Chen et al. | 257/676 |

* cited by examiner

*Primary Examiner* — Trung Q Dang
(74) *Attorney, Agent, or Firm* — Ishimaru & Associates LLP (57) ABSTRACT

A method of manufacture of an integrated circuit packaging system includes: providing a die attach pad integrally connected to a connector portion and a lead; attaching an integrated circuit die to the die attach pad; connecting an internal interconnect to the integrated circuit die and the lead; forming an encapsulation over the integrated circuit die; removing the connector portion to separate the die attach pad and the lead; and forming an isolation cover between the die attach pad and the lead.

20 Claims, 5 Drawing Sheets

INTEGRATED CIRCUIT PACKAGING SYSTEM WITH TIEBAR-LESS DESIGN AND METHOD OF MANUFACTURE THEREOF

TECHNICAL FIELD

The present invention relates generally to an integrated circuit packaging system, and more particularly to an integrated circuit packaging system having tiebar-less design.

BACKGROUND ART

Increased miniaturization of components, greater packaging density of integrated circuits ("ICs"), higher performance, and lower cost are ongoing goals of the computer industry. Semiconductor packaging structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, IC packages that are incorporated into these devices are required to be made smaller and thinner. The packaging configurations that house and protect IC require them to be made smaller and thinner as well.

Thus, a need still remains for an integrated circuit packaging system providing low cost manufacturing, improved yields, reduction of integrated circuit packaging dimensions, and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a die attach pad integrally connected to a connector portion and a lead; attaching an integrated circuit die to the die attach pad; connecting an internal interconnect to the integrated circuit die and the lead; forming an encapsulation over the integrated circuit die; removing the connector portion to separate the die attach pad and the lead; and forming an isolation cover between the die attach pad and the lead.

The present invention provides an integrated circuit packaging system including: a die attach pad; a lead adjacent to the die attach pad; an integrated circuit die attached to the die attach pad and connected to the lead with an internal interconnect; an encapsulation over the integrated circuit die; and an isolation cover between the die attach pad and the lead.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The depictions in the FIGs. are arbitrary for the most part. Generally, the invention can be operated in any orientation. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a direction parallel to a surface of the integrated circuit having bonding pads, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact between elements. The term "processing" as used herein includes deposition of material, patterning, exposure, development, etching, cleaning, molding, and/or removal of the material or as required in forming a described structure.

Figure 1:
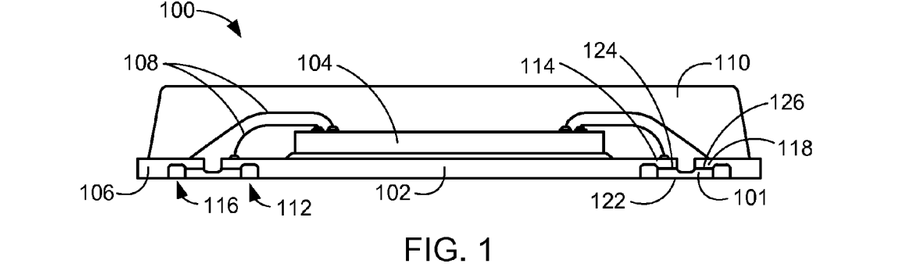
FIG. 1 is a cross-sectional view of an integrated circuit packaging system with an isolation cover along a line 1-1 of FIG. 2 in a first embodiment of the present invention.
Figure 2:
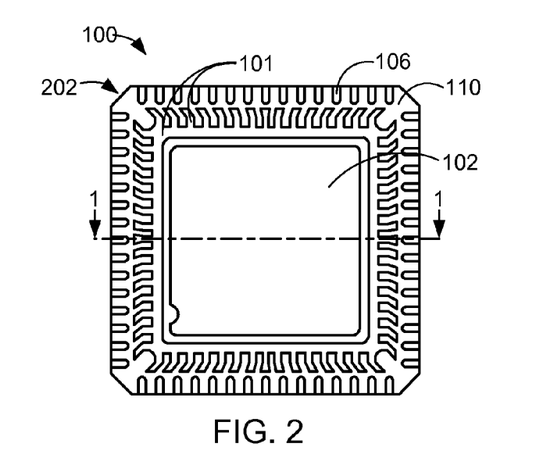
FIG. 2 is a bottom view of the integrated circuit packaging system.

Referring now to FIG. 1, therein is shown a cross-sectional view of an integrated circuit packaging system with an isolation cover 101 along a line 1-1 of FIG. 2 in a first embodiment of the present invention. The integrated circuit packaging system 100 can have a die attach pad 102, an integrated circuit die 104, a lead 106, an internal interconnect 108, and an encapsulation 110.

The die attach pad 102 can be a support structure for attaching the integrated circuit die 104. The die attach pad 102 can be a portion of a lead frame and can be located towards the interior of the integrated circuit packaging system 100. The die attach pad 102 can be made of conductive material and can be used to ground the integrated circuit packaging system 100.

The die attach pad 102 can have a pad-recess 112. The pad-recess 112 is defined as a depression in the die attach pad 102. The pad-recess 112 can be a portion of the die attach pad 102 having smaller thickness than the rest of the die attach pad 102. Details regarding the pad-recess 112 will be discussed below.

The die attach pad 102 can also have a pad-overhang portion 114. The pad-overhang portion 114 is defined as a portion of the die attach pad 102 having a smaller thickness than the rest of the die attach pad 102 and extending away from the central portion of the die attach pad 102 to create an overhang. The pad-overhang portion 114 can have the pad-recess 112.

The die attach pad 102 can have the pad-recess 112 on the bottom and near the perimeter of the die attach pad 102. The pad-overhang portion 114 can have the pad-recess 112 under the pad-overhang portion 114. The details regarding the pad-overhang portion 114 and the pad-recess 112 will be discussed below.

The integrated circuit die 104 is defined as a semiconductor device that has active circuitry fabricated thereon. The integrated circuit die 104 can have a bond pad on top for connecting to the active circuitry within the integrated circuit die 104.

The lead 106 is defined as a conductive structure for electrically coupling the integrated circuit packaging system 100 to external connections. The lead 106 can be electrically coupled to the integrated circuit die 104.

The lead 106 can be positioned on the perimeter of the integrated circuit packaging system 100. Multiple instances of the lead 106 can be placed around the perimeter of the integrated circuit packaging system 100 surrounding the die attach pad 102. The lead 106 can have horizontal surfaces that are coplanar with horizontal surfaces of the die attach pad 102. The lead 106 can be exposed on the bottom, along the perimeter, or a combination thereof of the integrated circuit packaging system 100. The lead 106 can also horizontally protrude outward from the perimeter of the integrated circuit packaging system 100.

The lead 106 can include a lead-recess 116. The lead-recess 116 can be a portion of the lead 106 having smaller thickness than the rest of the lead 106. The lead-recess 116 can be the product of a shaping process, which will be discussed in detail below.

The lead 106 can include a lead-overhang portion 118. The lead-overhang portion 118 is defined as a portion of the lead 106 having a smaller thickness than the rest of the lead 106 and extending toward the die attach pad 102 from a portion of the lead 106 on the perimeter of the integrated circuit packaging system 100.

The lead 106 can include the lead-recess 116 on the bottom of the lead 106 on a portion away from the perimeter of the integrated circuit packaging system 100. The lead 106 can have the lead-recess 116 under the lead-overhang portion 118. The details regarding the lead-overhang portion 118 and the lead-recess 116 will be discussed below.

The internal interconnect 108 can be directly attached to the pad on the top surface of the integrated circuit die 104 and the lead 106 or the die attach pad 102. For example, the internal interconnect 108 can include a bond wire or other conductive structure.

The internal interconnect 108 can provide an electrical connection between the integrated circuit die 104 and the interconnection structures of the integrated circuit packaging system 100, such as the lead 106 or the die attach pad 102. The internal interconnect 108 can attach to a top surface of the lead-overhang portion 118 or a top surface of the pad-overhang portion 114.

The encapsulation 110 can be over the integrated circuit die 104, the internal interconnect 108, the die attach pad 102, and the lead 106. The encapsulation 110 can encapsulate the integrated circuit die 104, the internal interconnect 108, the die attach pad 102, the lead 106, portions thereof, or a combination thereof.

The integrated circuit packaging system 100 can have an isolation cover 101, such as a mold filler or a coating layer. The isolation cover 101 is defined as a non-conductive material for covering conductive portions of the integrated circuit packaging system 100. The isolation cover 101 can be a separate structure from the encapsulation 110, having different composition or density, formed at a different time or using a different process, or a combination thereof.

The isolation cover 101 can be between the lead 106 and the die attach pad 102. The isolation cover 101 can be on a bottom surface of the lead-overhang portion 118, the pad-overhang portion 114, a portion of the encapsulation 110 between the lead 106 and the die attach pad 102, or a combination thereof.

The isolation cover 101 can be between the lead 106 and the pad-overhang portion 114. The encapsulation 110 can fill the pad-recess 112 and be between the pad-overhang portion 114 and the isolation cover 101. The encapsulation 110 can also fill the lead-recess 116 and be between the isolation cover 101 and the lead 106. The isolation cover 101 can abut the pad-recess 112, the lead-recess 116, or a combination thereof.

The isolation cover 101 can have a bottom cover surface 122 that is coplanar with a bottom surface of the encapsulation 110, a bottom surface of the lead 106, a bottom surface of the die attach pad 102, or a combination thereof. The bottom cover surface 122 can also be above the bottom surface of the encapsulation 110, the bottom surface of the lead 106, the bottom surface of the die attach pad 102, or the combination thereof. The integrated circuit packaging system 100 can have an isolation cavity (not shown) formed by the bottom cover surface 122 being above one or a combination of the other structures listed above.

The isolation cover 101 can have an inner top surface 124 contacting a bottom surface of the pad-overhang portion 114 and an outer top surface 126 contacting a bottom surface of the lead-overhang portion 118. The inner top surface 124, the outer top surface 126, or a combination thereof can be planar or smooth, characteristic of being formed on a surface that has been shaped using chemicals or molds. The inner top surface 124, the outer top surface 126, or a combination thereof can also have a patterned surface, characteristic of being formed on a surface that has been shaped using saws or lasers.

It has been discovered that the pad-overhang portion 114 and the lead-overhang portion 118 produced from the etching process provide improved bond connection. The pad-overhang portion 114 and the lead-overhang portion 118 produced from the etching process can maintain consistent planar top surfaces that is not altered during manufacturing. The consistency provided by the pad-overhang portion 114 and the lead-overhang portion 118 can provide consistent bonding locations and prevent deformations in the connection after the bonding process.

It has further been discovered that the pad-overhang portion 114, the lead-overhang portion 118, the pad-recess 112, and the lead-recess 116 provide improved yield rate at lower cost while maintaining structural integrity. The pad-overhang portion 114, the lead-overhang portion 118, the pad-recess 112, and the lead-recess 116 provide locking mechanism with the encapsulation 110 for the die attach pad 102 and the lead 106. Further the half etching processes for creating the pad-overhang portion 114, the lead-overhang portion 118, the pad-recess 112, and the lead-recess 116 can eliminate the need to separately shape and locate of the conventional locking mechanisms, which can improve the yield rate and decrease the production cost.

It has also been discovered that the isolation cover 101 having the inner top surface 124 and the outer top surface 126, such as a mold filler or a coating layer, provides decreased production cost while providing protection for and electrical isolation between the die attach pad 102 and the lead 106. It has further been discovered that the isolation cover 101 provide decreased production cost while maintaining high density of and narrow pitch between instances of the lead 106.

Referring now to FIG. 2, therein is shown a bottom view of the integrated circuit packaging system 100. The integrated circuit packaging system 100 can have the die attach pad 102 in the central portion of the integrated circuit packaging system 100.

The die attach pad 102 can have multiple instances of the pad-overhang portion 114 of FIG. 1 extending away from the center along the periphery of the die attach pad 102. The die attach pad 102 can also have the pad-overhang portion 114 as a single continuous structure, such as a ring, around the periphery of the die attach pad 102

Multiple instances of the lead 106 can be along the periphery of the integrated circuit packaging system 100. The integrated circuit packaging system 100 can have the isolation cover 101 between each instance of the lead 106 and the die attach pad 102.

The integrated circuit packaging system 100 can have a tiebar-less corner portion 202 between two instances of the lead 106 abutting a corner of the integrated circuit packaging system 100. The tiebar-less corner portion 202 is defined as a contiguous portion of a corner of the integrated circuit packaging system 100 not having any breaks therein. The tiebar-less corner portion 202 can be the portion of the encapsulation 110 between two instances of the lead 106 each on adjacent sides at the corner of the integrated circuit packaging system 100 and absent tie bars.

The integrated circuit packaging system 100 can be manufactured without any tie bars. The absence of the tie bars can create the tiebar-less corner portion 202 consisting of the encapsulation 110 and not the tie bars.

It has been discovered that the tiebar-less corner portion 202 not having the tie bar improves the density of the leads. The tiebar-less corner portion 202 can free up the space in the corner otherwise occupied by the tie bars, which can be used to place more leads without increasing the overall size of the integrated circuit packaging system 100.

It has also been discovered that tiebar-less corner portion 202 provide decrease in voids or damages within the encapsulation 110. The tiebar-less corner portion 202 can allow for the mold gate located at the corner to flow larger amounts of the material for the encapsulation 110 at a more constant rate to keep the mold flow condition more constant, which eliminates voids within the integrated circuit packaging system 100. The tiebar-less corner portion 202 can also eliminate cutting of tie bars after forming the encapsulation 110 which can cause damages to the encapsulation 110 or the structures encapsulated therein.

Figure 3:
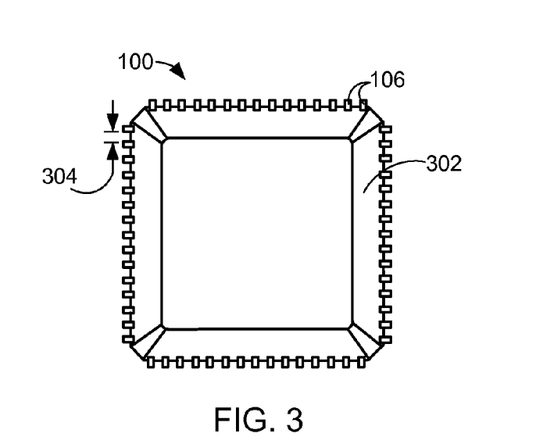
FIG. 3 is a top view of the integrated circuit packaging system.

Referring now to FIG. 3, therein is shown a top view of the integrated circuit packaging system 100. The integrated circuit packaging system 100 can have a contiguous upper surface 302. The contiguous upper surface 302 can have a top surface of the encapsulation 110 of FIG. 1 and upper portions of peripheral walls of the encapsulation 110. The contiguous upper surface 302 can be a contiguous and unbroken surface and can extend down to where the lead 106 is exposed through the encapsulation 110.

Because the integrated circuit packaging system 100 can be manufactured without any tie bars, the integrated circuit packaging system 100 can have the surface of the encapsulation 110 that is not interrupted by portions of the tie bars exposed after singulation. Thus, the absence of the tie bars can create the contiguous upper surface 302.

The integrated circuit packaging system 100 can have a pitch 304 between multiple instances of the lead 106 along each of peripheral sides. The pitch 304 is defined as a distance between consecutive pairs of the lead 106 along a peripheral side of the package. The pitch 304 can be constant between all pairs along the peripheral side or between all pairs along all peripheral sides. The pitch 304 can be small and regular due to the manufacturing process of lead frames.

Because the integrated circuit packaging system 100 can be manufactured without any tie bars, the integrated circuit packaging system 100 can have the pitch 304 constant along the peripheral side and not interrupted by portions of the tie bars exposed after singulation. Thus, the absence of the tie bars can create a regular pattern of the pitch 304, with all instances of the lead 106 uniformly spaced apart by the pitch 304 along the peripheral side or all peripheral sides. Moreover, the pitch 304 can be narrow, such as in fine-pitch lead frames, as a characteristic of being manufactured using lead frames.

It has been discovered that the tiebar-less corner portion 202 of FIG. 2 and the contiguous upper surface 302 provide improved yield rate. The tiebar-less corner portion 202 and the contiguous upper surface 302 improve yield rate by eliminating the need to cut through tie bars during singulation, which can cause cracks in the encapsulation 110 deformation of the structures encapsulated thereon.

Figure 4:
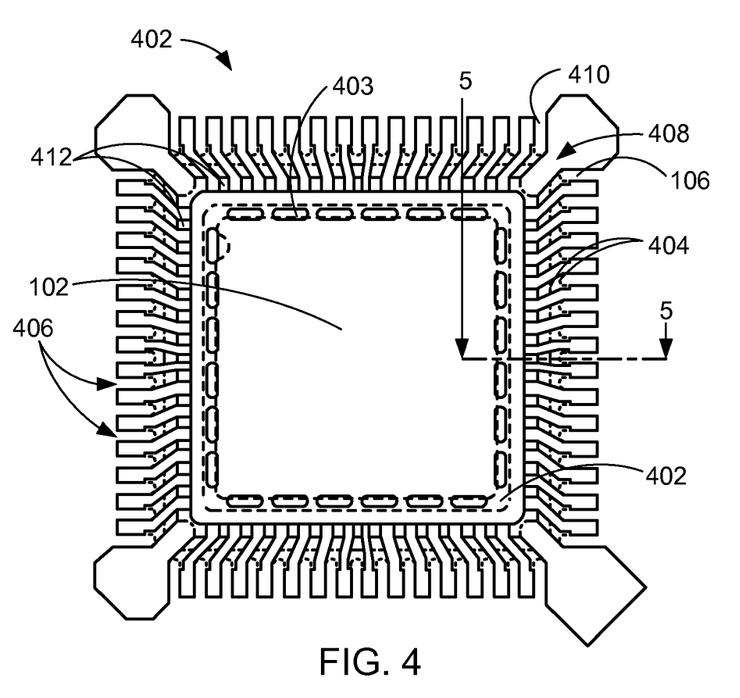
FIG. 4 is a top view of a tiebar-less lead frame for manufacturing the integrated circuit packaging system of FIG. 1.

Referring now to FIG. 4, therein is shown a top view of a tiebar-less lead frame 402 for manufacturing the integrated circuit packaging system 100 of FIG. 1. For illustrative purposes, dashed lines are shown in reference to the integrated circuit packaging system 100. However, it is understood that these lines are for reference only and that they do not exist on the tiebar-less lead frame 402.

For example, a ring 402 around the periphery of the die attach pad 102 can represent the pad-recess 112 of FIG. 1 on the bottom side of the die attach pad 102. A boundary-line pair 404 on the lead 106 can represent the lead-recess 116 of FIG. 1 on the bottom side of the lead 106.

The tiebar-less lead frame 402 can have a slot 403. The slot 403 can be an opening in the die attach pad 102. The slot 403 can have various shapes. The slot can be circular, rectangular, oval, or a combination thereof. The slot 403 can extend from the top surface to the bottom surface of the die attach pad 102. The slot 403 can be collinear with the pad-recess 112, abutting the pad-recess 112, or a combination thereof. The slot 403 can be used to separate instances of the pad-overhang portion 114 of FIG. 1, flow the material for the encapsulation 110 of FIG. 1, or a combination thereof.

The tiebar-less lead frame 402 is defined as a support structure having electrically conductive portions and not having any tie bars for manufacturing the integrated circuit packaging system 100. The tiebar-less lead frame 402 can have the die attach pad 102 in the middle portion of the tiebar-less lead frame 402. The tiebar-less lead frame 402 can have a lead-leg portion 406 integrally connected to the die attach pad 102.

The lead-leg portion 406 is defined as a continuous structure extending horizontally away from the die attach pad 102. The lead-leg portion 406 can be used to form the pad-overhang portion 114. The lead-leg portion can have the lead 106 integrally connected to the die attach pad 102 as a single continuous structure. The lead-leg portion 406 can have the pad-recess 112 of FIG. 1 and the lead-recess 116 along the single continuous structure.

The tiebar-less lead frame 402 can have the pad-recess 112 and the lead-recess 116 as results of shaping processes, such as in a half-etching or molding process. The tiebar-less lead frame 402 can also have plated portions to guide shaping processes as a pre-plated lead frame. Details regarding the depressed portions of the tiebar-less lead frame 402 will be discussed below.

The tiebar-less lead frame 402 can have a corner spacing 408 between instances of the lead 106 around a corner of the die attach pad 102. The corner spacing 408 is defined as a space between adjacent conductive structures abutting a corner portion of the tiebar-less lead frame 402.

For example, the tiebar-less lead frame 402 can have the lead 106 integrally connected at an end of a peripheral edge of the die attach pad 102. The tiebar-less lead frame 402 can also have a further lead 410 integrally connected at an end of another peripheral edge joining the peripheral edge to form a corner. The corner spacing 408 can be the spacing separating the lead 106 and the further lead 410 abutting the corner of the die attach pad 102 and the corner of the tiebar-less lead frame 402. The corner spacing 408 can be encapsulated to form the tiebar-less corner portion 202 of FIG. 2 during manufacturing.

The tiebar-less lead frame 402 can have the corner spacing 408 instead of a tie bar. The tiebar-less lead frame 402 can have the corner spacing 408 due to the absence of the tie bar. The integral connection of the die attach pad 102 and the lead 106 can support the die attach pad 102 instead of the tie bar. The integral connection of the die attach pad 102 and the lead 106 can place the integrated circuit die 104 of FIG. 1 and manipulate it to manufacture the integrated circuit packaging system 100.

It has been discovered that the tiebar-less lead frame 402 having the corner spacing 408 and the lead-leg portion 406 instead of the tie bar improves the density of the leads. The tiebar-less lead frame 402 having the corner spacing 408 and the lead-leg portion 406 can free up the space in the corner otherwise occupied by the tie bars, which can be used to place more leads.

The tiebar-less lead frame 402 can have a separation recess 412 on the top surface of the lead-leg portion 406. The separation recess 412 can be a depression in the top surface of the lead-leg portion 406. The separation recess 412 can be between the die attach pad 102 and the lead 106 on the lead-leg portion 406. Details regarding the separation recess 412 will be discussed below.

Figure 5:
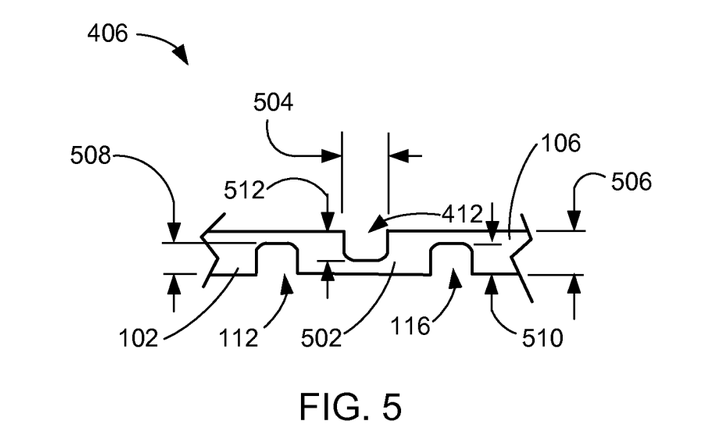
FIG. 5 is a detailed cross-sectional view of the tiebar-less lead frame of FIG. 4 along a line 5-5 of FIG. 4.

Referring now to FIG. 5, therein is shown a detailed cross-sectional view of the tiebar-less lead frame 402 of FIG. 4 along a line 5-5 of FIG. 4. The tiebar-less lead frame 402 can have the die attach pad 102 and the lead 106 integrally connected as one continuous structure of the lead-leg portion 406.

The die attach pad 102 and the lead 106 can have both the pad-overhang portion 114 of FIG. 1 of the die attach pad 102 and the lead 106 integrally connected to a connector portion 502 in the lead-leg portion 406. The connector portion 502 can be between by the pad-recess 112 and the lead-recess 116. Top and bottom surfaces of the connector portion 502 can be coplanar with top and bottom surfaces of the lead 106 and the die attach pad 102.

The connector portion 502 can have the separation recess 412 on the top surface thereof. The separation recess 412 can be between the lead-recess 116 and the pad-recess 112. The vertical or angles surfaces of the separation recess 412 can become the end surfaces of the pad-overhang portion 114 and the lead-overhang portion 118 of FIG. 1. The connector portion 502 or a portion thereof can be removed to isolate the die attach pad 102 from the lead 106 during manufacturing process.

The separation recess 412 can have a separation length 504. The separation length 504 can be measured in direction from the die attach pad 102 to the lead 106.

The continuously integral structure having the lead 106, the connector portion 502, and the die attach pad 102 can have a vertical thickness 506. The vertical thickness 506 can be controlled to ensure structural integrity of the tiebar-less lead frame 402 during the manufacturing process.

The pad-recess 112 can have a pad-recess depth 508, the lead-recess 116 can have a lead-recess depth 510, and the separation recess 412 can have a separation depth 512. The various depths are defined as the vertical distance between the surface surrounding the depression to the planar surface at the bottom or apex of the depressions.

For example, the pad-recess depth 508 can be the distance between the bottom surface of the die attach pad 102 and the top horizontally planar surface within the pad-recess 112. Also, for example, the lead-recess depth 510 can be the distance between the bottom surface of the lead 106 and the top horizontally planar surface within the lead-recess 116. For further example, the separation depth 512 can be the distance between the top surface of the connector portion 502 and the bottom planar horizontal surface within the separation recess 412.

The various depths for depressions within the tiebar-less lead frame 402 can be defined by the vertical thickness 506. For example, the separation length 504 can be greater than or equal to 0.8 times the vertical thickness 506.

Also, for example, the pad-recess depth 508, the lead-recess depth 510, the separation depth 512, or a combination thereof can be greater than half the vertical thickness 506 but less than the vertical thickness 506. The pad-recess depth 508, the lead-recess depth 510, the separation depth 512, or a combination thereof can be equal to each other.

It has been discovered that the separation length 504 greater than or equal to 0.8 times the vertical thickness 506 provide maximum bonding area for locating multiple instances of the internal interconnect 108 of FIG. 1 at one instance of the lead 106. It has also been discovered that the separation length 504 greater than or equal to 0.8 times the vertical thickness 506 shifts the bonding zone of the lead closer to the die attach pad 102. The relationship between the separation length 504 the vertical thickness 506 can reduce manufacturing cost by reducing the length or material for the internal interconnect 108 of FIG. 1.

The pad-recess 112, the lead-recess 116, the separation recess 412, or a combination thereof can have vertical side walls connected to rounded corners. The rounded corners can be connected to a planar horizontal surface. The pad-recess 112, the lead-recess 116, the separation recess 412, or a combination thereof can have a 'U' like shape.

The pad-recess 112, the lead-recess 116, the separation recess 412, or a combination thereof can also have a 'V' like shape. The pad-recess 112, the lead-recess 116, the separation recess 412, or a combination thereof can have angled planar side walls meeting at a vertex angle to form a rounded corner. The pad-recess 112, the lead-recess 116, the separation recess 412, or a combination thereof can be the result of the half-etching process.

Figure 6:
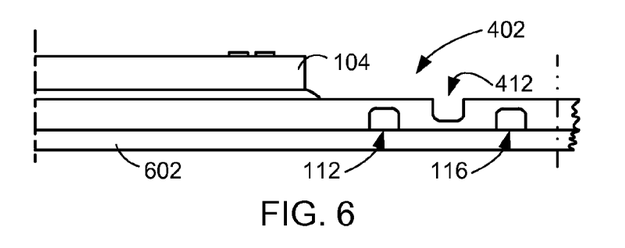
FIG. 6 is an arrangement of the tiebar-less lead frame and the integrated circuit die for manufacturing the various embodiments of the present invention.

Referring now to FIG. 6, therein is shown an arrangement of the tiebar-less lead frame 402 and the integrated circuit die 104 for manufacturing the various embodiments of the present invention. The tiebar-less lead frame 402 can be on a down-holder 602.

The tiebar-less lead frame 402 can have bottom surfaces that are coplanar to each other. For example, the bottom surfaces of the lead 106 of FIG. 1, the die attach pad 102 of FIG. 1, the connector portion 502 of FIG. 5, or a combination thereof can be coplanar with each other. The coplanar bottom surfaces can all contact the top surface of the down-holder 602.

The integrated circuit die 104 can be attached to the top surface of the die attach pad 102. The integrated circuit die 104 can be attached in the central portion of the die attach pad 102. The integrated circuit die 104 can be attached to the die attach pad 102 using adhesive material.

The tiebar-less lead frame 402 can have the pad-recess 112, the separation recess 412, the lead-recess 116, or a combination thereof. The pad-recess 112, the separation recess 412, the lead-recess 116, or a combination thereof can be produced using half-etching processes.

Further, the pad-recess 112, the separation recess 412, the lead-recess 116, or a combination thereof be produced using multiple shaping processes. The shaping processes can include a variety of processes. For example, the shaping processes can include chemical or laser etching, grinding, partial sawing, stamping, molding, or a combination thereof.

For further example, a first shaping process, such as a molding or chemical etching process, can create the separation recess 412 on the top portion of the tiebar-less lead frame 402. A second shaping process, such as a chemical etching or stamping process, can create the pad-recess 112, the lead-recess 116, or a combination thereof. Further etching processes can be used to further shape or create the pad-recess 112, the lead-recess 116, or a combination thereof, or shape the recesses.

The shaping processes can be controlled to create the pad-recess 112, the separation recess 412, the lead-recess 116, or a combination thereof having the pad-recess depth 508 of FIG. 5, the lead-recess depth 510 of FIG. 5, the separation depth 512 of FIG. 5, the separation length 504 of FIG. 5, or a combination thereof. The various depths can be relative to the vertical thickness 506 of FIG. 5 of the lead-leg portion 406 of FIG. 4.

Figure 7:
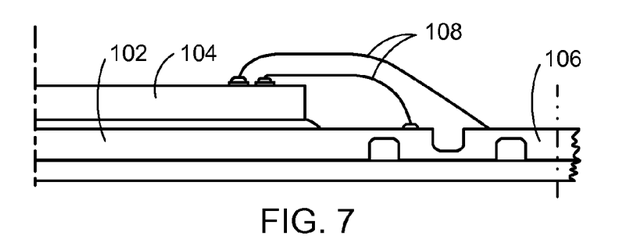
FIG. 7 is the structure of FIG. 6 with the internal interconnect attached thereon.

Referring now to FIG. 7, therein is shown the structure of FIG. 6 with the internal interconnect 108 attached thereon. The internal interconnect 108, such as bare metal or insulated wire, can attach to the pad on the top side of the integrated circuit die 104. The internal interconnect 108 can also attach to the die attach pad 102, including the pad-overhang portion 114 of FIG. 1, the lead 106, including the lead-overhang portion 118 of FIG. 1, or a combination thereof.

Figure 8:
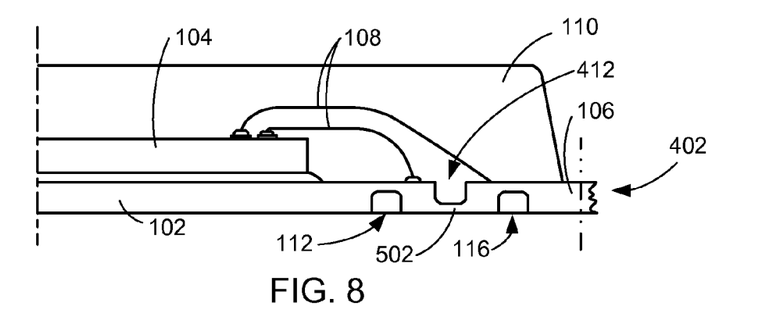
FIG. 8 is the structure of FIG. 7 encapsulated with the encapsulation.

Referring now to FIG. 8, therein is shown the structure of FIG. 7 encapsulated with the encapsulation 110. The material for the encapsulation can be pushed through a mold gate and into a mold over the structure of FIG. 7.

The material for the encapsulation 110 can cure over the tiebar-less lead frame 402 and encapsulate the die attach pad 102, the lead 106, the integrated circuit die 104, the internal interconnect 108, or a combination thereof. The encapsulation 110 can also fill the pad-recess 112, the lead-recess 116, the separation recess 412, or a combination thereof.

It has been discovered that the tiebar-less lead frame 402 with the instances of the lead 106 having the corner spacing 408 of FIG. 4 provide decrease in voids within the encapsulation 110. The lead 106 having the corner spacing 408 allow for the mold gate located at the corner to flow larger amounts of the material for the encapsulation 110 at a more constant rate to keep the mold flow condition more constant, which eliminates voids within the integrated circuit packaging system 100 of FIG. 1.

It has also been discovered that the coplanar surfaces of the lead 106, the die attach pad 102, and the connector portion 502 provide lower damage rate for the lead 106 during encapsulation. The coplanar surfaces fully contact and support the lead 106 and prevents misfits between the lead 106 and the down-holder 602 of FIG. 6, which can cause damages to the lead 106 during encapsulation process. Further, the coplanar surfaces eliminate the need for designing the down-holder 602 to completely fit the lead 106, which can decrease production cost.

It has further been discovered that the lead-leg portion 406 of FIG. 4 having the connector portion 502 prevent lead floating and bonding failure. The lead-leg portion 406 having the connector portion 502 can eliminate the misfit between the down-holder 602 and the lead frame which can cause bending in the lead near the bonding area.

Figure 9:
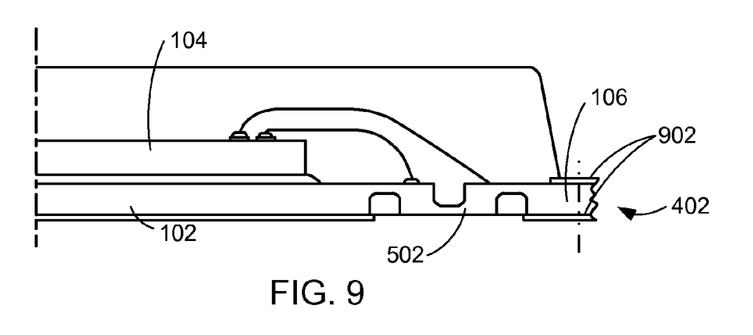
FIG. 9 is the structure of FIG. 8 with a protective layer attached thereon.

Referring now to FIG. 9, therein is shown the structure of FIG. 8 with a protective layer 902 attached thereon. The protective layer 902 can be attached on the bottom surface of the die attach pad 102, top surface of the lead 106, the bottom surface of the lead 106 or a combination thereof. The bottom surface of the connector portion 502 can be exposed.

Alternatively, the protective layer 902 can be attached prior to the mounting, the bonding, or the encapsulation process. For example, the tiebar-less lead frame 402 can be a pre-plated lead frame having the protective layer 902 plated thereon. The integrated circuit die 104 can be attached to the tiebar-less lead frame 402 having the protective layer 902.

Figure 10:
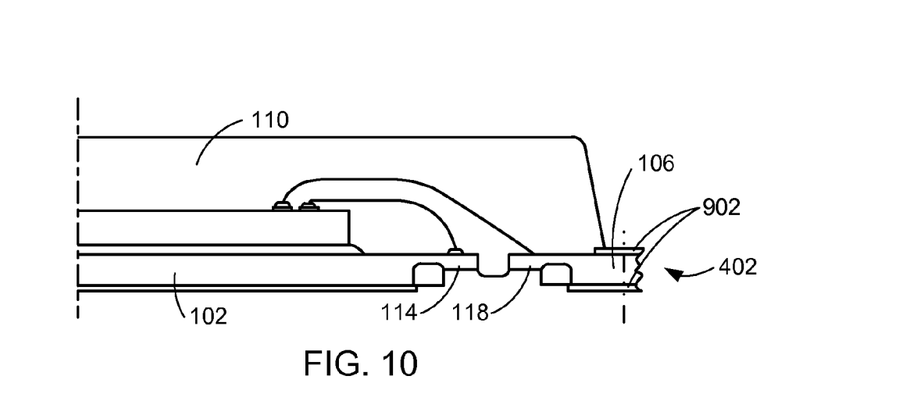
FIG. 10 is the structure of FIG. 9 after a shaping process.

Referring now to FIG. 10, therein is shown the structure of FIG. 9 after a shaping process. The structure of FIG. 9 can be shaped, such as using chemical or a grinder. The portions of the tiebar-less lead frame 402 having the protective layer 902 can remain unaffected by the shaping process. The exposed portions of the tiebar-less lead frame 402 can be etched away during the process.

For example, the connector portion 502 of FIG. 5 of the tiebar-less lead frame 402 can be removed. The shaping process can remove the connector portion 502 and isolate the lead 106 from the die attach pad 102. The shaping process can expose the pad-overhang portion 114, the lead-overhang portion 118, or a combination thereof on the bottom of the structure of FIG. 9. For example, the shaping process can form a bottom planar surface on the pad-overhang portion 114 and a bottom planar surface on the lead-overhang portion 118.

It has been discovered that the pad-overhang portion 114 and the lead-overhang portion 118 produced from the etching process provide improved bond connection. The pad-overhang portion 114 and the lead-overhang portion 118 produced from the etching process can maintain consistent planar top surfaces that is not altered during manufacturing. The consistency provided by the pad-overhang portion 114 and the lead-overhang portion 118 can provide consistent bonding locations and prevent deformations in the connection after the bonding process.

It has further been discovered that the pad-overhang portion 114, the lead-overhang portion 118, the pad-recess 112 of FIG. 1, and the lead-recess 116 of FIG. 1 provide improved yield rate at lower cost while maintaining structural integrity. The pad-overhang portion 114, the lead-overhang portion 118, the pad-recess 112, and the lead-recess 116 provide locking mechanism with the encapsulation 110 for the die attach pad 102 and the lead 106. Further the half etching processes for creating the pad-overhang portion 114, the lead-overhang portion 118, the pad-recess 112, and the lead-recess 116 can eliminate the need to separately shape and locate of the conventional locking mechanisms, which can improve the yield rate and decrease the production cost.

Figure 11:
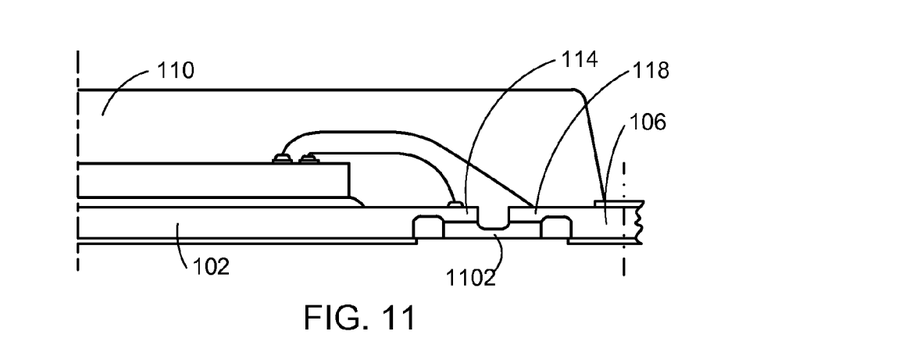
FIG. 11 is the structure of FIG. 10 with a mold filler attached thereon.

Referring now to FIG. 11, therein is shown the structure of FIG. 10 with a mold filler 1102 attached thereon. The mold filler 1102 can be a type of the isolation cover 101 of FIG. 1. The mold filler 1102 is defined as a resin type of material used to cover and protect conductive material. The mold filler 1102 can be used to fill the void between the pad-overhang portion 114 and the lead-overhang portion 118 created from removing the connector portion 502 of FIG. 5.

The mold filler 1102 can be the same material as the encapsulation 110 or a different type of epoxy or resin material. The mold filler 1102 can have a bottom surface that is coplanar with the bottom surface of the lead 106, the bottom surface of the die attach pad 102, or a combination thereof. The mold filler 1102 can have an edge that is distinguishable from the encapsulation 110. The edge can be detectable due to the difference in material, the separate molding and curing procedures, or a combination thereof.

It has been discovered that the isolation cover 101, such as the mold filler 1102, provides decreased production cost while providing protection for and electrical isolation between the die attach pad 102 and the lead 106. It has further been discovered that the isolation cover 101 and the connector portion 502 provide decreased production cost while maintaining high density of and narrow pitch between instances of the lead 106.

Figure 12:
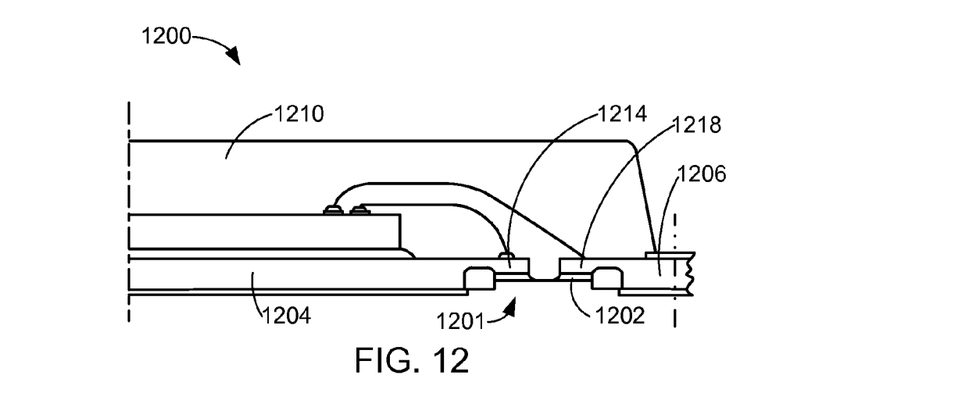
FIG. 12 is an integrated circuit packaging system with an isolation cover during a manufacturing process in a second embodiment of the present invention.

Referring now to FIG. 12, therein is shown an integrated circuit packaging system 1200 with an isolation cover 1201 during a manufacturing process in a second embodiment of the present invention. The integrated circuit packaging system 1200 can be the structure of FIG. 10 with a coating layer 1202 applied thereon. The coating layer 1202 can be a type of the isolation cover 1201.

The integrated circuit packaging system 1200 can be similar to the integrated circuit packaging system 100 of FIG. 1. For example, the integrated circuit packaging system 1200 can have a die attach pad 1204, a lead 1206, an encapsulation 1210, a pad-overhang portion 1214, a lead-overhang portion 1218, or other structures that are respectively similar to the die attach pad 102 of FIG. 1, the lead 106 of FIG. 1, the pad-overhang portion 114 of FIG. 1, the lead-overhang portion 118 of FIG. 1, or other similar structures of FIG. 1.

The coating layer 1202 is defined as a non-conductive paste, film, or laminated or molded layer used to cover and protect conductive material. The coating layer 1202 can be the same or different material than the encapsulation 1210. The coating layer 1202 can be applied in the void between the pad-overhang portion 114 of FIG. 10 and the lead-overhang portion 118 of FIG. 10 created from removing the connector portion 502 of FIG. 9.

The coating layer 1202 can cover the surfaces of the pad-overhang portion 1214 and the lead-overhang portion 1218 exposed on the bottom. The coating layer 1202 can have a thickness that is sufficient to cover the exposed surfaces. The coating layer 1202 can have a bottom surface that is planar or having varying heights. The coating layer 1202 can also have the bottom surface coplanar with or above the bottom surfaces of the die attach pad 1204, the encapsulation 1210, the lead 1206, or a combination thereof.

It has been discovered that the isolation cover 1201, such as the coating layer 1202, provides decreased production cost while providing protection for and electrical isolation between the die attach pad 1204 and the lead 1206. It has further been discovered that the isolation cover 1201 and the connector portion 502 provide decreased production cost while maintaining high density of and narrow pitch between instances of the lead 1206.

The structure shown in FIG. 12 can be further processed through the manufacturing process to become the integrated circuit packaging system 1200. For example, the structure shown in FIG. 12 is during the manufacturing process of the integrated circuit packaging system 1200, which can be completed with singulation, such as punch-type or saw-type singulation methods, after applying the isolation cover 1201.

Figure 13:
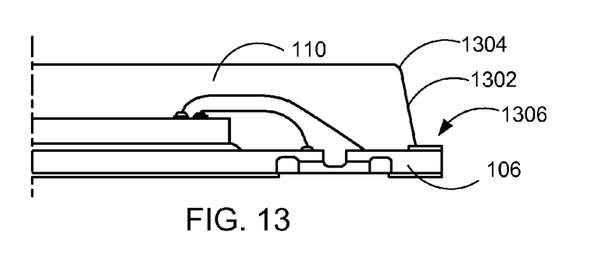
FIG. 13 is the structure of FIG. 11 after a punch-type singulation process.

Referring now to FIG. 13, therein is shown the structure of FIG. 11 after a punch-type singulation process. The singulation process can shape the encapsulation 110 and create the tiebar-less corner portion 202 of FIG. 2 and the contiguous upper surface 302 of FIG. 3. The punch-type singulation process can form a sloped peripheral wall 1302 on the periphery of the encapsulation 110, a rounded top corner 1304 around the top of the periphery of the encapsulation 110, a protruding portion 1306 of the lead 106, or a combination thereof.

It has been discovered that the tiebar-less corner portion 202 and the contiguous upper surface 302 provide improved yield rate. The tiebar-less corner portion 202 and the contiguous upper surface 302 improve yield rate by eliminating the need to cut through tie bars during singulation, which can cause cracks in the encapsulation 110 deformation of the structures encapsulated thereon.

Figure 14:
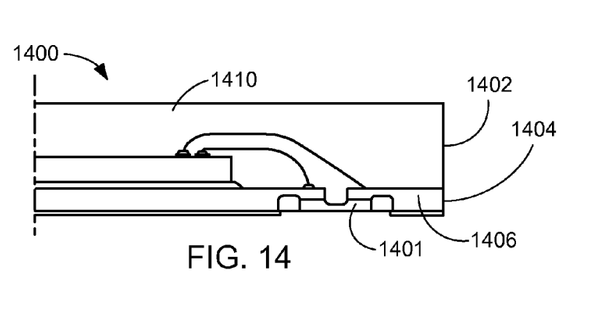
FIG. 14 is an integrated circuit packaging system with an isolation cover in a third embodiment of the present invention.

Referring now to FIG. 14, therein is shown an integrated circuit packaging system 1400 with an isolation cover 1401 in a third embodiment of the present invention. The integrated circuit packaging system 1400 can be the structure of FIG. 11 after a saw-type singulation process in a third embodiment of the present invention.

The saw-type singulation process can produce a vertical encapsulation-wall 1402 on the periphery of an encapsulation 1410, a vertical lead-wall 1404 on the periphery end of a lead 1406. The vertical encapsulation-wall 1402 can be coplanar to the vertical lead-wall 1404.

The integrated circuit packaging system 1400 can be similar to the integrated circuit packaging system 100 of FIG. 1.

For example, the integrated circuit packaging system 1400 can have the lead 1406 and the encapsulation 1410 respectively similar to the lead 106 of FIG. 1 and the encapsulation 110 of FIG. 1. Also for example, the singulation process can shape the encapsulation 1410 and form structures or portions similar to the tiebar-less corner portion 202 of FIG. 2 and the contiguous upper surface 302 of FIG. 3.

It has been discovered that the tiebar-less corner portion 202 and the contiguous upper surface 302, or structures corresponding thereto, provide improved yield rate. The tiebar-less corner portion 202 and the contiguous upper surface 302 improve yield rate by eliminating the need to saw through tie bars during singulation, which can cause cracks in the encapsulation 110 deformation of the structures encapsulated thereon.

Figure 15:
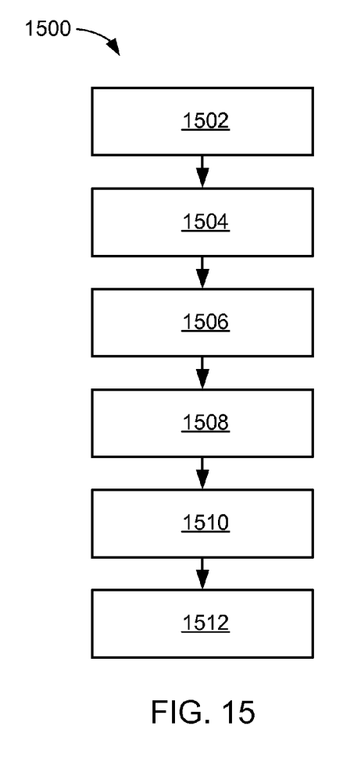
FIG. 15 is a flow chart of a method for manufacture of an integrated circuit packaging system of FIG. 1 in a further embodiment of the present invention.

Referring now to FIG. 15, therein is shown a flow chart of a method 1500 for manufacture of an integrated circuit packaging system 100 of FIG. 1 in a further embodiment of the present invention. The method 1500 includes providing a die attach pad integrally connected to a connector portion and a lead in a block 1502; attaching an integrated circuit die to the die attach pad in a block 1504; connecting an internal interconnect to the integrated circuit die and the lead in a block 1506; forming an encapsulation over the integrated circuit die in a block 1508; removing the connector portion to separate the die attach pad and the lead in a block 1510; and forming an isolation cover between the die attach pad and the lead in a block 1512.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit packaging system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit packaging system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a tiebar-less lead frame having:
      a die attach pad having a pad-recess on a bottom side of the die attach pad,
      a connector portion integrally connected to the die attach pad,
      a lead integrally connected to the connector portion and having a lead-recess on a bottom side of the lead;
   attaching an integrated circuit die to the die attach pad;
   attaching an internal interconnect to the integrated circuit die and the lead;
   forming an encapsulation over the integrated circuit die, with the encapsulation filling the pad-recess and the lead-recess;
   removing the connector portion to separate the die attach pad and the lead; and
   covering the die attach pad and the lead with an isolation cover.

2. The method as claimed in claim 1 further comprising:
   forming a pad-overhang portion on the die attach pad between the pad-recess and the lead; and
   forming a lead-overhang portion on the lead between the lead and the die attach pad.

3. The method as claimed in claim 1 wherein:
   providing the tiebar-less lead frame includes providing the tiebar-less lead frame having a regular pattern of a pitch between consecutive pairs of the lead along a peripheral side; and
   further comprising:
   forming a contiguous upper surface from a top portion of the encapsulation down to a top portion of the lead.

4. The method as claimed in claim 1 wherein providing the tiebar-less lead frame includes providing the tiebar-less lead frame having the die attach pad not connected to a tie bar.

5. The method as claimed in claim 1 wherein providing the tiebar-less lead frame includes providing the tiebar-less lead frame having a vertical thickness and the pad-recess having a pad-recess depth greater than half of the vertical thickness, and the lead-recess having a lead-recess depth greater than half of the vertical thickness.

6. An integrated circuit packaging system comprising:
   a die attach pad, the die attach pad includes a pad-recess on a bottom side of the die attach pad;
   a lead adjacent to the die attach pad, the lead includes a lead-recess on a bottom side of the lead;
   an integrated circuit die attached to the die attach pad and connected to the lead with an internal interconnect;
   an encapsulation over the integrated circuit die, the encapsulation fills the pad-recess and the lead-recess; and
   an isolation cover between the die attach pad and the lead.

7. The system as claimed in claim 6 wherein the isolation cover is a mold filler.

8. The system as claimed in claim 6 wherein the isolation cover is a coating layer.

9. The system as claimed in claim 6 wherein the encapsulation includes a sloped peripheral wall along a perimeter portion of the encapsulation.

10. The system as claimed in claim 6 wherein:
    the encapsulation includes a vertical encapsulation-wall along a perimeter portion of the encapsulation; and
    the lead includes a vertical lead-wall on a peripheral side of the lead, with the vertical lead-wall coplanar with the vertical encapsulation-wall.

11. The system as claimed in claim 6 wherein:
    the die attach pad includes a pad-overhang portion between the pad-recess and the lead; and
    the lead includes a lead-overhang portion between the lead and the die attach pad.

12. An integrated circuit packaging system comprising:
    a die attach pad, the die attach pad includes a pad-recess on a bottom side of the die attach pad;
    a plurality of leads, including a first lead adjacent to the die attach pad, the first lead having a lead-recess on a bottom side of the first lead, the plurality of leads having a regular pattern of a pitch between consecutive pairs of the plurality of leads along a peripheral side;
    an intergrated circuit die attached to the die attached and connected to the first lead with an internal interconnect;

an encapsulation over the integrated circuit die, the encapsulation fills the pad-recess and the lead-recess, the encapsulation includes a contiguous upper surface from a top portion of the encapsulation down to a top portion of the plurality of leads; and an isolation cover between the die attach pad and the first lead.

13. The system as claimed in claim 6 wherein die attach pad is not connected to a tie bar.

14. The system as claimed in claim 6 wherein:
the lead includes a vertical thickness and the lead-recess having a lead-recess depth greater than half of the vertical thickness; and
the pad-recess having a pad-recess depth greater than half of the vertical thickness.

15. The system as claimed in claim 12 wherein the isolation cover is a mold filler or a coating layer.

16. The system as claimed in claim 12 wherein the encapsulation includes a sloped peripheral wall along a perimeter portion of the encapsulation.

17. The system as claimed in claim 12 wherein:
the encapsulation includes a vertical encapsulation-wall along a perimeter portion of the encapsulation; and
the first lead includes a vertical lead-wall on a peripheral side of the first lead, with the vertical lead-wall coplanar with the vertical encapsulation-wall.

18. The system as claimed in claim 12 wherein:
the die attach pad includes a pad-overhang portion between the pad-recess and the first lead; and
the first lead includes a lead-overhang portion between the first lead and the die attach pad.

19. The system as claimed in claim 12 wherein die attach pad is not connected to a tie bar.

20. The system as claimed in claim 12 wherein:
the first lead includes a vertical thickness and the lead-recess having a lead-recess depth greater than half of the vertical thickness; and
the pad-recess having a pad-recess depth greater than half of the vertical thickness.

* * * * *

UNITED STATES PATENT AND TRADEMARK OFFICE
CERTIFICATE OF CORRECTION

| | |
|---|---|
| PATENT NO. | : 8,637,974 B2 |
| APPLICATION NO. | : 13/523261 |
| DATED | : January 28, 2014 |
| INVENTOR(S) | : Zheng |

Page 1 of 1

It is certified that error appears in the above-identified patent and that said Letters Patent is hereby corrected as shown below:

In the Claims:

Column 14, claim 12, line 66, delete "an intergrated circuit die attached to the die attached and" and insert therefor --an integrated circuit die attached to the die attach pad and--

Signed and Sealed this
Twenty-seventh Day of October, 2015

Michelle K. Lee
*Director of the United States Patent and Trademark Office*